United States Patent [19]
van de Ven et al.

[11] Patent Number: 5,578,532
[45] Date of Patent: Nov. 26, 1996

[54] WAFER SURFACE PROTECTION IN A GAS DEPOSITION PROCESS

[75] Inventors: Everhardus P. van de Ven, Cupertino; Eliot K. Broadbent; Jeffrey C. Benzing, both of San Jose; Barry L. Chin, Sunnyvale; Christopher W. Burkhart, San Jose, all of Calif.

[73] Assignee: Novellus Systems, Inc., San Jose, Calif.

[21] Appl. No.: 294,514

[22] Filed: Aug. 23, 1994

Related U.S. Application Data

[60] Continuation-in-part of Ser. No. 7,457, Jan. 22, 1993, Pat. No. 5,374,594, which is a division of Ser. No. 554,225, Jul. 16, 1990, Pat. No. 5,230,741.

[51] Int. Cl.⁶ ............... C23C 16/00; C23C 14/04
[52] U.S. Cl. ............ 437/245; 437/247; 437/248; 437/925; 29/25.01; 427/248.1
[58] Field of Search ............ 29/25.01; 437/245, 437/248, 247, 925; 148/DIG. 6; 118/724, 728, 732; 427/248.1

[56] References Cited

U.S. PATENT DOCUMENTS

| | | | |
|---|---|---|---|
| 4,184,188 | 1/1980 | Briglia | 361/234 |
| 4,261,762 | 4/1981 | King | 148/1.5 |
| 4,457,359 | 7/1984 | Holden | 165/80 C |
| 4,466,872 | 8/1984 | Einbinder | 118/715 |
| 4,508,161 | 4/1985 | Holden | 165/1 |
| 4,512,391 | 4/1985 | Harra | 165/48 R |
| 4,523,985 | 6/1985 | Dimock | 204/298 |
| 4,527,620 | 7/1985 | Pedersen et al. | 165/800 |
| 4,530,635 | 7/1985 | Englebrecht et al. | 414/627 |
| 4,535,834 | 8/1985 | Turner | 165/800 |
| 4,567,938 | 2/1986 | Turner | 165/80 R |

(List continued on next page.)

FOREIGN PATENT DOCUMENTS

| | | |
|---|---|---|
| 0260150 | 3/1988 | European Pat. Off. . |
| 0291181A2 | 4/1988 | European Pat. Off. ......... H01J 37/32 |
| 2559953 | 2/1985 | France ...................... 21/68 |
| 2566682 | 6/1985 | France . |
| 3633386 | 4/1988 | Germany . |
| 3633386A1 | 4/1988 | Germany ................. C23C 14/28 |
| 57-85235 | 5/1982 | Japan ................. H01L 21/30 |
| 59-3945 | 1/1984 | Japan ................. H01L 21/68 |
| 60-136314 | 7/1985 | Japan . |
| 1178122 | 7/1989 | Japan ................. G03C 11/00 |
| 8600059 | 1/1986 | Netherlands . |
| WO82/01482 | 11/1981 | WIPO . |

OTHER PUBLICATIONS

Benveniste, "Wafer Cooling in High Current Ion Implanter," Nuclear Instruments and Methods in Physics Research B21, North–Holland, Amsterdam, 1987, pp. 366–371.

(List continued on next page.)

*Primary Examiner*—George Fourson
*Assistant Examiner*—David E. Graybill
*Attorney, Agent, or Firm*—Skjerven, Morrill, MacPherson, Franklin & Friel; David E. Steuber

[57] ABSTRACT

A process comprising a platen having a substrate contact supporting a substrate during the deposition of tungsten, metal nitrides, other metals, and silicides in a chemical vapor deposition reactor. A deposition control gas composed of a suitable inert gas such as argon or a mixture of inert and reactant gases such as argon and hydrogen is introduced through a restrictive opening into an ambient in the reactor. An exclusion guard is positioned adjacent to the substrate contact and has an extension extending over a frontside peripheral region of the substrate. Deposition control gas is introduced through an opening beneath the exclusion guard extension and exits through a restrictive opening between the exclusion guard extension and a substrate frontside peripheral region. The restrictive opening provides a uniform deposition control gas flow at a pressure greater than reactor ambient pressure and process gas pressure impinging on the frontside of the substrate. Deposition control gas flows uniformly through the restrictive opening across the entire substrate frontside peripheral region, thereby preventing deposition on the substrate edge and backside.

20 Claims, 9 Drawing Sheets

U.S. PATENT DOCUMENTS

| | | | |
|---|---|---|---|
| 4,575,408 | 3/1986 | Bok | 204/192 E |
| 4,603,466 | 8/1986 | Morley | 29/569 R |
| 4,682,566 | 7/1987 | Aitken | 118/724 |
| 4,687,682 | 8/1987 | Koze | 437/238 |
| 4,709,655 | 12/1987 | Van Mastright | 118/719 |
| 4,724,621 | 2/1988 | Hobson et al. | 34/218 |
| 4,738,748 | 4/1988 | Kisa | 156/345 |
| 4,743,570 | 5/1988 | Lamont, Jr. | 437/248 |
| 4,767,641 | 7/1988 | Kieser et al. | 427/38 |
| 4,817,558 | 4/1989 | Itoh | 118/725 |
| 4,857,142 | 8/1989 | Syverson | 156/646 |
| 4,859,364 | 8/1989 | Cathey et al. | 204/298 |
| 4,911,103 | 3/1990 | Davis et al. | 118/725 |
| 4,960,488 | 10/1990 | Law et al. | 156/643 |
| 4,986,215 | 1/1991 | Yamada et al. | 118/728 |
| 4,990,374 | 2/1991 | Keeley et al. | 427/225.1 |
| 5,000,113 | 3/1991 | Wang et al. | 118/723 |
| 5,033,407 | 7/1991 | Mizuno et al. | 118/725 |
| 5,033,538 | 7/1991 | Wagner et al. | 165/80.1 |
| 5,094,885 | 3/1992 | Selbrede | 427/248.1 |
| 5,133,284 | 7/1992 | Thomas et al. | 118/719 |
| 5,138,973 | 8/1992 | Davis et al. | 118/719 |
| 5,198,753 | 3/1993 | Hamburgen | 324/158 F |
| 5,238,499 | 8/1993 | Van De Ven et al. | 118/724 |
| 5,326,725 | 7/1994 | Shertinsky et al. | 437/225 |
| 5,328,722 | 7/1994 | Ghanayem et al. | 427/250 |
| 5,637,262 | 8/1991 | Moll et al. | 156/345 |

OTHER PUBLICATIONS

Bogle–Rohwer et al., "Wall Profile Control in a Triode Etcher," Solid State Technology, Apr. 1985, pp. 251–255.

Douglas–Hamilton et al., "End Station Design and Wafer Quality Control For A High Current Oxygen Implantation," Nuclear Instruments and Methods in Physics Research B21, North–Holland, Amsterdam, 1987, pp. 324–327.

Durzinko et al., "Studies of Anhydrous HF Preoxidation Treatment of Silicon Surfaces," Abstract No. 257. (No Date Available).

Egerton et al., "Positive Wafer Temperature Control to Increase Dry Etch Throughout and Yield," Solid State Technology, Aug. 1982, pp. 84–87.

Evans, "A Generalized Mathematical Model For Wafer Cooling With Gas," Nuclear Instruments and Methods in Physics Research B21, North–Holland, Amsterdam, 1987, pp. 385–390.

Hammer, "Cooling Ion Implantation Target," IBM Technical Disclosure Bulletin, vol. 19, No. 6, Nov. 1976, app. 2270–2271.

Hoffman et al., "Individual Wafer Metallization Utilizing Load–Locked, Close–Coupled Conical Magnetron Sputtering," Solid State Technology, Feb. 1981, pp. 105–11 and 120.

Hussla et al., "In Situ Silicon–Wafer Temperature Measurements During RF Argon–Ion Plasma Etching via Fluoroptic Thermometry," J. Phys. D: Appl. Physc. 20, 1987, pp. 889–896.

Kawai et al., "PR–80 High Current Ion Implantation Machine," Nuclear Instruments and Methods in Physics Research B21, North–Holland, Amsterdam, 1987, pp. 239–244.

King et al., "Experiments On Gas Cooling of Wafers," Nuclear Instruments and Methods 189, North–Holland Publishing Company, 1981, pp. 169–173.

Komatsu et al., "A High Throughput End Station of a High Current Ion Implantation," Nuclear Instruments and Methods in Physics Research B21, North–Holland, Amsterdam, 1987, pp. 317–320.

Mack, "Wafer Cooling in Ion Implantation," In Ion Implantation: Equipment and Techniques, H. Ryssel and H. Glawischnig, eds., Springer14 Verlag, Berlin, 1983, pp. 221–232.

Mathod, "Design Consideration For A High Pressure, High Etch Rate Single Wafer Reactor," The Electrochemical Society, Proceedings of the Sixth Symposium on Plasma Processing, vol. 87–6, 1987, pp. 134–138.

Mears, "New Method of Solid State Wafer Cooling in the Extron 1000 High Current Ion Implantation System," Nuclear Instruments and Methods in Physics Research B37/38, North–Holland, Amsterdam, 1989, pp. 460–463.

Nakamura et al., "The Effect of Wafer Temperature on Reactive Ion Etching," The Electro–Chemical Society, Proceedings of the Symposium on dry Process, vol. 88–7, 1988, pp. 78–85.

Ryding, "Target Chambers For Ion Implantation Using Mechanical Scanning," Nuclear Instruments and Methods 189, North–Holland Publishing Company, 1981, pp. 239–251.

Ryssel et al., "Ion Implantation," John Wiley & Sons, Chichester, 1986, pp. 152–160.

Saitoh, et al., "Impurity Gettering of Polycrystalline Solar Cells Fabricated from Refined Metallurgical–Grade Silicon," IEEE Transactions on Electron Devices, vol. Ed–27, No. 4, Apr. 1980, pp. 671–677.

Scaife, "The Veeco 4840 Automatic Implant System," Nuclear Instruments and Methods in Physics Research B21, North–Holland, Amsterdam, 1987, pp. 258–263.

Steen, et al., "The Precision Implant 9000, A New Concept In Ion Implantation Systems," Nuclear Instruments and Methods in Physics Research B21, North–Holland, Amsterdam, 1987, pp. 328–333.

Syverson et al., "Contamination Aspects of Anhydrous HF Gas Processing," Solid State Technology, Oct. 1988, pp. 101–104.

Taylor et al., "200 mm End Station For Ion Beam Implanters," Nuclear Instruments and Methods in Physics Research B21, North–Holland, Amsterdam, 1987, pp. 224–228.

Turner et al., "Advances in Cassette–to–Cassette Sputtercoating Systems," Solid State Technology, Jul. 1983, pp. 115–123.

Wauk, "New Ion Implantation System With Advanced Process Capabilities," Nuclear Instruments and Methods in Physics Research B21, North–Holland, Amsterdam, 1987, pp. 280–284.

VLSI Research, Inc., "Integrated Processing Systems." Nov. 1990, p. 12.

Solid State Technology, Aug. 1991, p. 66.

Engineering News, Novellus Enters Tungsten CVD, Sep. 17, 1990.

WAFER SURFACE PROTECTION IN A GAS DEPOSITION PROCESS

CROSS-REFERENCE TO RELATED APPLICATION

This application is a continuation-in-part of application Ser. No. 08/007,457, filed Jan. 22, 1993, now U.S. Pat. No. 5,374,594; which is a division of application Ser. No. 07/554,225, filed Jul. 16, 1990, now U.S. Pat. No. 5,230,741.

BACKGROUND OF THE INVENTION

1. Field of the Invention

This invention relates to semiconductor processing, and more particularly to the protection of backside and edge of wafers during semiconductor processing operations.

2. Description of Related Art

Chemical vapor deposition ("CVD") is a gas reaction process commonly used in the semiconductor industry to form thin layers of material known as films over an integrated circuit substrate. The CVD process is based on the thermal, plasma, or thermal and plasma decomposition and reaction of selected gases. The most widely used CVD films are silicon dioxide, silicon nitride, and polysilicon, although a wide variety of CVD films suitable for insulators and dielectrics, semiconductors, conductors, superconductors, and magnetics are well known.

Particulate contamination of CVD films must be avoided. A particularly troublesome source of particulates in the chemical vapor deposition of metals and other conductors such as tungsten, tungsten silicide, and titanium nitride, is the film that forms on the edge and backside of the wafer under certain conditions. For example, if the wafer edge and backside are unprotected or inadequately protected during deposition, a partial coating of the CVD material forms on the wafer edge and backside, respectively. This partial coating tends to peel and flake easily for some types of materials, introducing particulates into the chamber during deposition and subsequent handling steps.

Many approaches have been developed for addressing the problem of material deposition on the wafer backside. In one approach, the material is permitted to form on the backside, but then is removed immediately following the deposition step using an in-situ plasma etch. This approach entails additional process steps and requires additional equipment capabilities, and also affects the flatness of the wafer. In another approach, the wafer is clamped onto a substrate holder in an attempt to seal and isolate the backside region from the CVD gas. An adequate seal tends to be difficult to achieve in practice, and the mechanical motion between the clamp and the wafer itself causes particulates. Yet another approach is disclosed in U.S. Pat. No. 4,817,558, issued Apr. 4, 1989 to Itoh. A substrate support member having the form of a cylinder is provided with a flat bearing surface on which the substrate rests. Three pins protrude from the peripheral edge portion of the bearing surface. The sidewalls of the substrate are insulated from the reactive gases by a cover, which is further provided with a lifted and bent region that surrounds the substrate at the level of the substrate. The lifted and bent region is said to trap the reactive gas on the lateral face of the wafer, thereby preventing a film from being deposited on the wafer backside.

SUMMARY OF THE INVENTION

Undesirable deposition of materials on the wafer backside and edge, is diminished or eliminated in the present invention, while good temperature and material deposition uniformity is maintained across the frontside of the wafer. An apparatus for supporting a wafer during wafer processing in a process chamber and for preventing deposition on a frontside peripheral region and edge of the wafer, comprising a platen having a wafer contact to support the wafer, having a deposition control gas pathway, and having a periphery surface region surrounding the wafer contact, and an exclusion guard having a platform surface removably positioned on the periphery surface region, having an extension extending over a frontside peripheral region of the wafer, wherein the extension is separated from the wafer frontside peripheral region by a restrictive opening during wafer processing.

BRIEF DESCRIPTION OF THE DRAWINGS

In the drawings, in which like reference numerals refer to like parts.

DESCRIPTION OF THE PREFERRED EMBODIMENT

Figure 1:
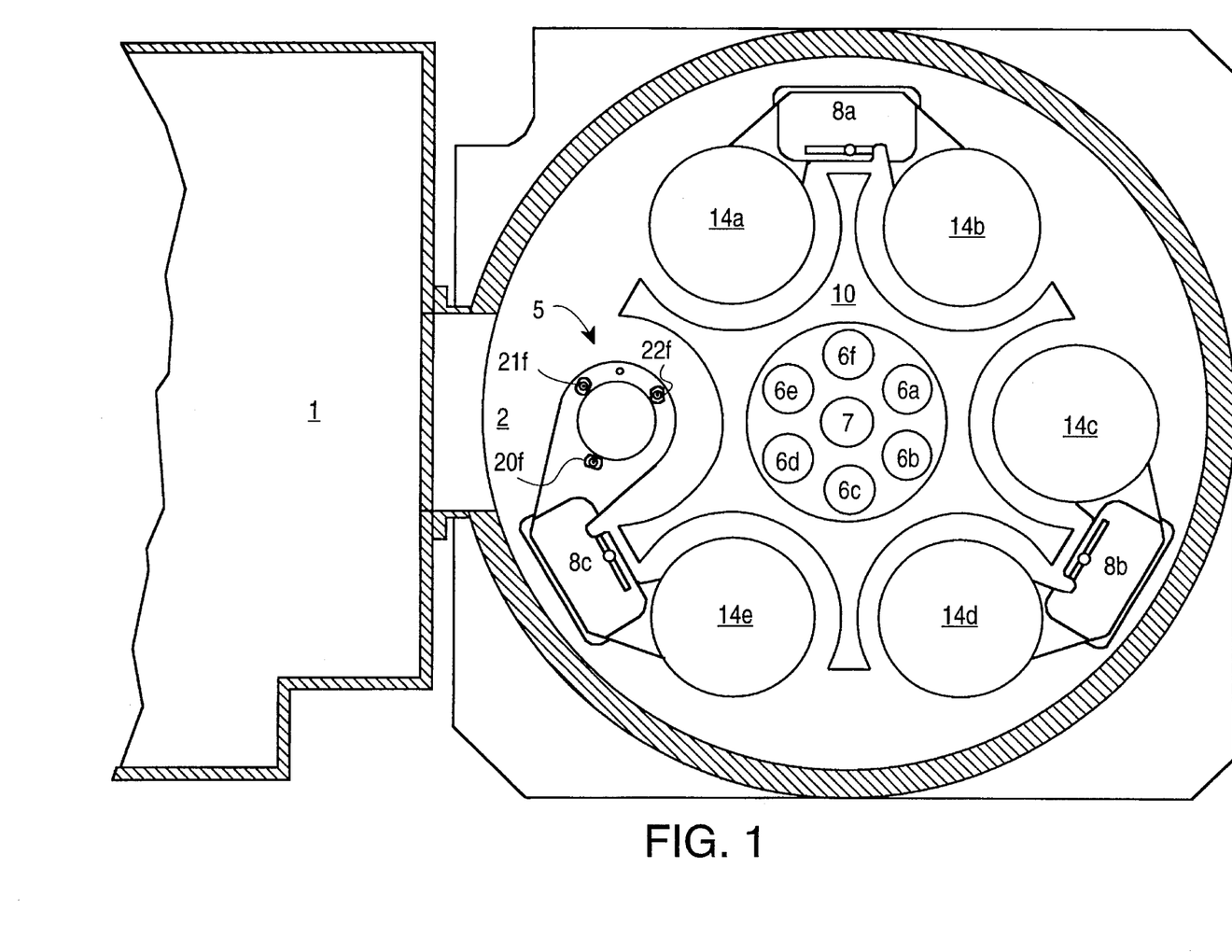
FIG. 1 is a cross-sectional view of a process chamber for a chemical vapor deposition system, as viewed from above.

An illustrative reaction chamber of a high pressure chemical vapor deposition ("CVD") apparatus is shown in FIG. 1 from a top cross sectional view, cross sectioned directly above wafer transport mechanism 10 in an "up" position. The process chamber 2 communicates with a load lock chamber 1, from which wafers to be processed are introduced into the process chamber 2, and into which processed wafers are received from the process chamber 2. Chamber gases are exhausted through vent ports 6a–6f. A shaft opening 7 is located adjacent to vent ports 6a–6f. The system for moving wafers from station to station in the process chamber 2 includes pin lift platforms 8a–8c and wafer transport mechanism 10. Platen blocks 14a–14e are not drawn to scale so that other features may be more readily apparent.

Figure 2:
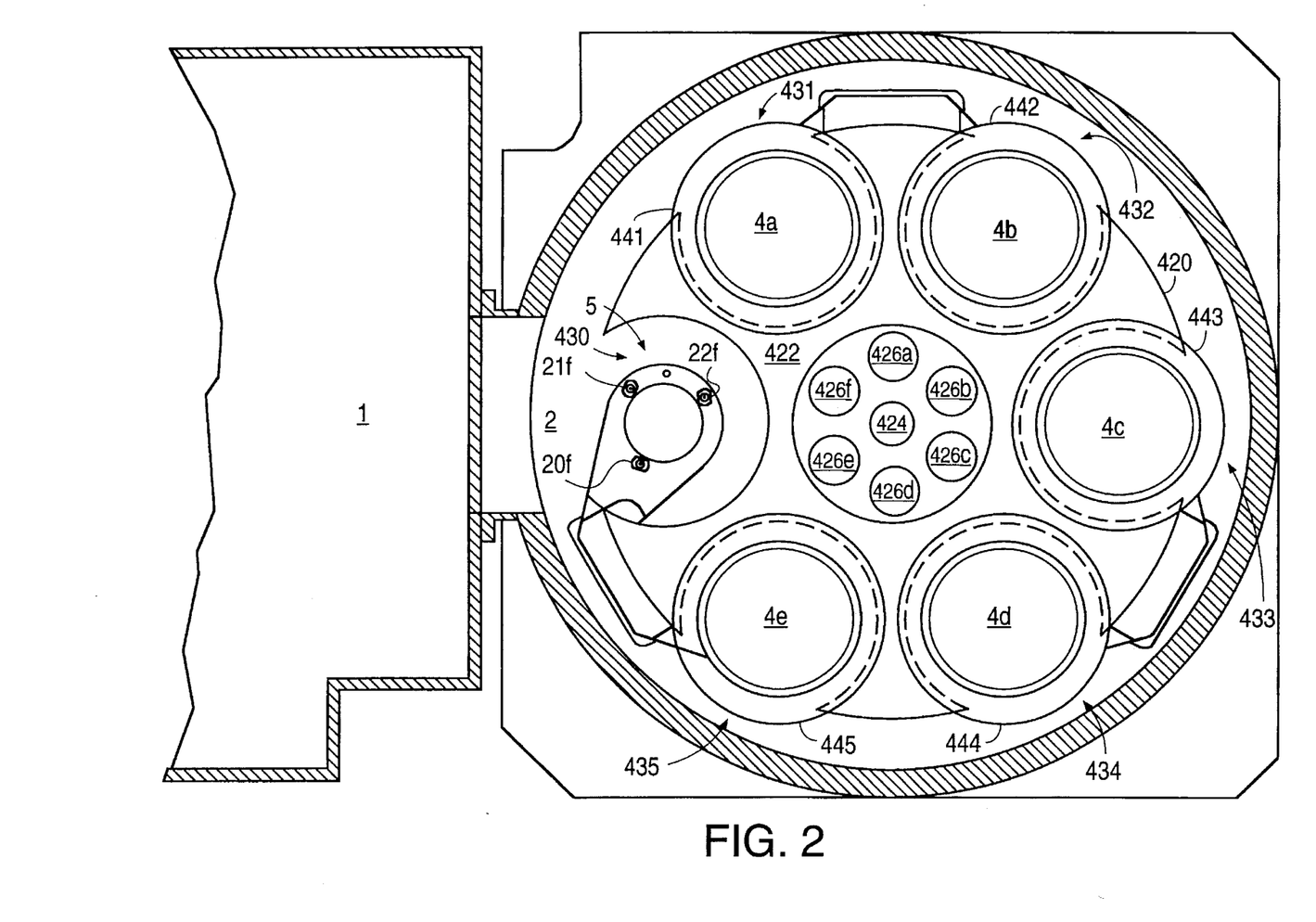
FIG. 2 is a cross-sectional view of the process chamber of FIG. 1 illustrating exclusion guards and an exclusion guard lift assembly.

FIG. 2 is a top cross sectional view of load lock chamber 1 and process chamber 2 illustrating the employment of an exclusion guard lift assembly 420 suitable for exclusion guarding or unguarding of the wafer process stations 4a–4e in conjunction with exclusion guards 441–445. A circular exclusion guard lift plate 422 is provided with six semi-circular cutout regions 430–435 associated with a load/unload station 5 and the five wafer process stations 4a–4e, respectively. Cutout regions 431–435, which are associated with the process stations 4a–4e, are of a diameter just greater than the diameter of the platen blocks 14a–14e but just less than the outside diameter of the exclusion guards 441–445. The cutout regions 431–435 are designed to engage respectively the five exclusion guards 441–445. The five exclusion guards 441–445 generally represent the exclusion guards discussed below. Cutout regions 431–435, exclusion guards 441–445, and process stations 4a–4e are not drawn to scale so that other features may be more readily apparent.

Figure 3:
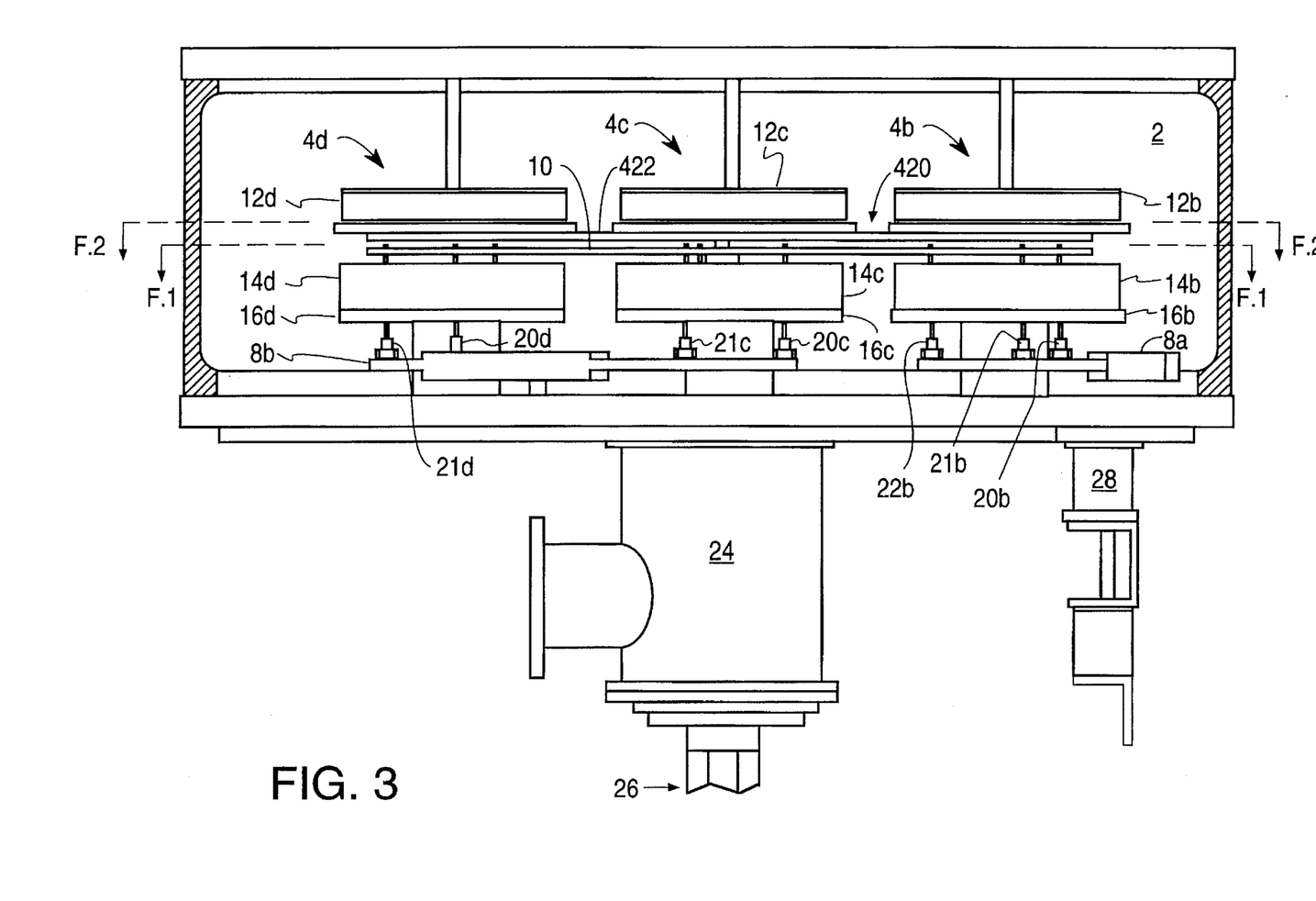
FIG. 3 is a cross-sectional view of the process chamber of FIG. 1, as viewed from a side.

Typically, all of the process stations 4a–4e are either exclusion guarded or unguarded, although the process stations 4a–4e may be variously exclusion guarded or unguarded as desired merely by mounting or omitting respective ones of the corresponding exclusion guards 441–445. The exclusion guards 441–445 are engaged by the exclusion guard lift plate 422 in any suitable manner. For example, in FIG. 2, the exclusion guards 441–445 are respectively aligned with cutout regions 431–435 and are merely contacted and lifted by the upper surface of the exclusion guard lift plate 422 as the exclusion guard lift plate 422 in conjunction with exclusion guard lift assembly 420 and a spindle lift/rotation mechanism (not shown) rises above the platen block 14a–14e (FIG. 3). The spindle lift/rotation mechanism is described in U.S. Pat. No. 5,238,499, by Van de Ven et al., which is hereby incorporated by reference in its entirety. Note that the exclusion guards 441–445 are accessible for cleaning and changing merely by removing the top of the process chamber 2. Note also that no exclusion guard is mounted to the exclusion guard lift plate 422 at cutout region 430, which is associated with the load/unload station 5.

In FIG. 3, wafer process stations 4b, 4c, and 4d are visible in more detail in a side view of the high pressure CVD reaction chamber. Process stations 4b–4d are not drawn to scale so that other features may be more readily apparent. Process station 4c, for example, includes a dispersion head 12c for introducing a process gas or gas mixture over a wafer to be processed; the platen 14c for supporting the wafer to be processed; a pedestal base 16c, which includes a heater for heating platen 14c and indirectly supplying heat to the wafer to be processed; and pin lift platform 8b, which is associated with pins 20c, 21c and 22c (hidden) for lifting and lowering the wafer to be processed in coordination with activation of the wafer transport mechanism 10. Similarly, process station 4b includes gas dispersion head 12b, platen 14b, pedestal base 16b, and pin lift platform 8a in association with pins 20b, 21b and 22b. Similarly, process station 4d includes gas dispersion head 12d, platen 14d, pedestal base 16d, and pin lift platform 8b in association with pins 20d, 21d and 22d (hidden). Also shown in FIG. 3 are a vacuum exhaust port 24, a spindle lift/rotation mechanism 26, and a pin lift mechanism 28, the design of which are well known in the art. Process stations 4a and 4e are preferably similar to process stations 4b–4d. The assembly of the pedestal bases 16a–16e to platens 14a–14e, respectively and the composition of each are fully described in U.S. Pat. No. 5,238,499 and in U.S. Pat. No. 5,230,741, by van de Ven et. al. U.S. Pat. No. 5,230,741 is also hereby incorporated by reference in its entirety.

The exclusion guard lift assembly 420 is mounted within process chamber 2 as shown in FIG. 3. Suitable approaches for coupling the exclusion guard lift assembly 420 in vertical movement with the wafer transport mechanism 10 (FIG. 1), while allowing the exclusion guard lift mechanism to be rotationally static relative to the process stations 4a–4e during rotation of the wafer transport mechanism 10 are described in conjunction with a shroud lift assembly in U.S. Pat. No. 5,238,499. U.S. Pat. No. 5,238,499 additionally describes the physical configuration and operation involved in transporting, guarding, and unguarding of the wafers to be processed.

The wafer to be processed is introduced into the process chamber 2 from the load lock chamber 1 at a reduced pressure such as 40 Torr, and is received at an empty load/unload station 5 and lowered onto raised lift pins 20f, 21f and 22f. By coordinating the rotation of wafer transport mechanism 10 and the raising and lowering of the lift pins 20a–20f, 21a–21f, and 22a–22f, the wafers are transported to successive ones of the stations 4a–4e and 5. As the wafer transport mechanism 10 rises toward a level suitable for engaging wafers at the stations 4a–4e and 5, the exclusion guard lift plate 422 also rises, thereby lifting exclusion guards 441–445 to clear the space above the process stations 4a–4e for transport of the wafers. As the wafer transport mechanism 10 lowers from the level suitable for engaging wafers at the stations 4a–4e and 5, the exclusion guard lift assembly 420 also lowers. Note that the motion of lift pins 20a–20f and 22a–22f follows the upward motion movement of transport mechanism 10 and exclusion guard lift assembly 420, and precedes the downward movement of transport mechanism 10 and exclusion guard lift assembly 420. When the wafer at the load/lock station 5 is fully processed, it is removed into the load lock chamber 1.

When the exclusion guard lift assembly 420 is lowered, the exclusion guards 441–445 are deposited on the top of the platens 14a–14e at the respective process stations 4a–4e, thereby exclusion guarding the wafers. The platens 14a–14e are constructed in the manner of platen 200 and platen blocks 202 and 1206, described below. Various measures may be taken to retain the exclusion guards 441–445 in place. For example, FIG. 2 shows an approach in which the exclusion guards 441–445 are made to be of a suitable weight so that gravity acts to retain the exclusion guards in place.

The physical configuration and operation of the high pressure CVD apparatus of FIGS. 1, 2, and 3 and the elements therein are otherwise set forth in U.S. Pat. No. 5,230,741.

A pedestal base suitable for pedestal bases 16b, 16c and 16d is described in U.S. Pat. 5,230,741.

When the pins 20a–20f, 21a–21f, and 22a–22f at the stations 4a–4e and 5 (FIGS. 2 and 3) lower, the wafers to be processed are deposited on respective platens 14a–14e under respective gas dispersion heads 12a–12e. Once the wafers are deposited on the respective platens 14a–14e, the wafers are preferably secured to the respective platens 14a–14e. Several techniques for securing the wafers to a wafer contact on a respective platen may be used. One preferable technique uses a vacuum chuck, for example, a suitable vacuum, for example, a pressure of 20–40 Torr less than the process chamber pressure, is maintained in the vacuum chucks of the respective process stations 4a–4e. The term "vacuum" is used herein in a relative sense to mean a pressure less than another pressure, e.g. the pressure in the vacuum chucks at the respective process stations 4a–4e relative to a pressure in the process chamber 2.

Figure 4:
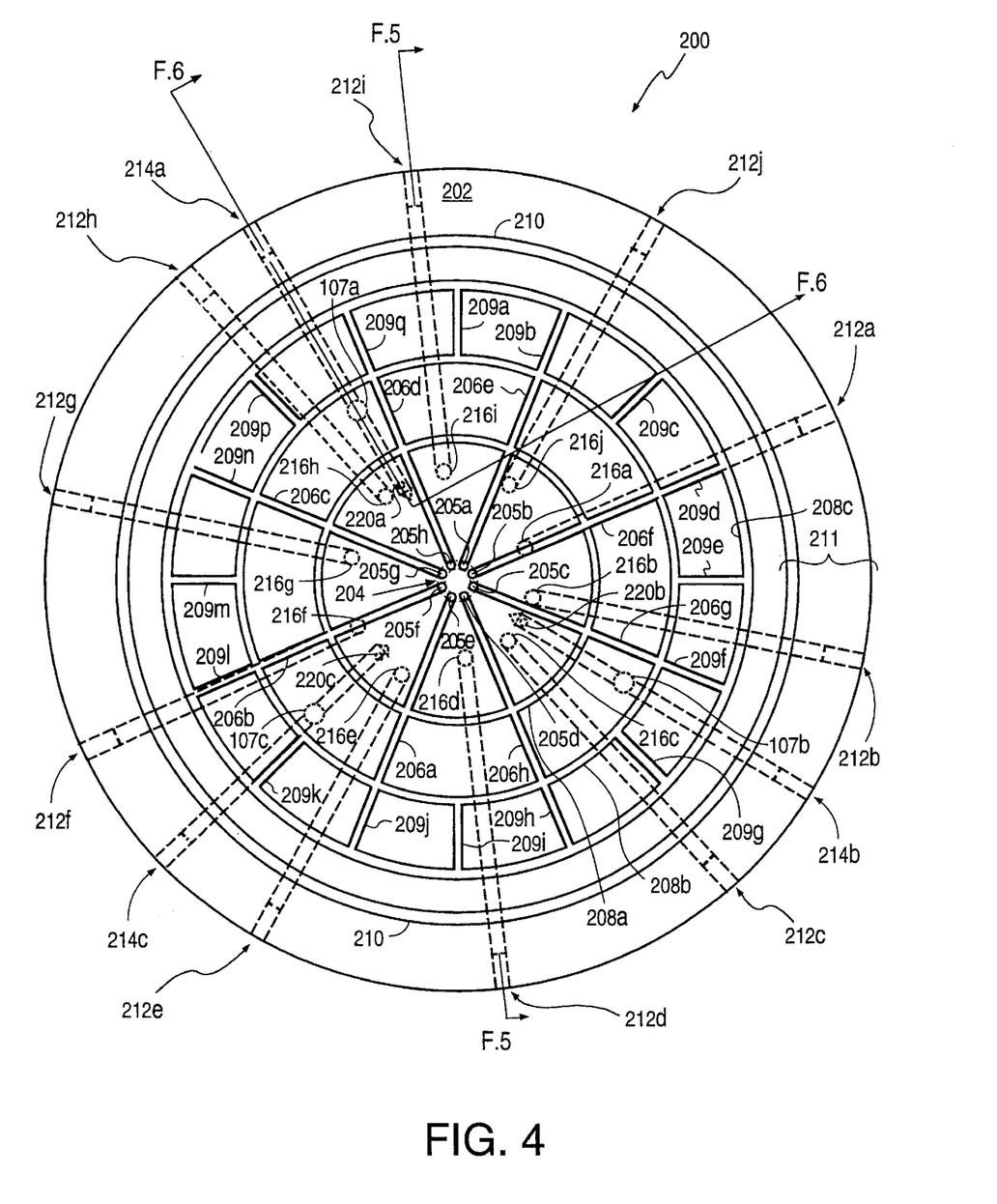
FIG. 4 is a top plan view of a platen illustrative of one embodiment of the platens shown in FIG. 3.
Figure 5:
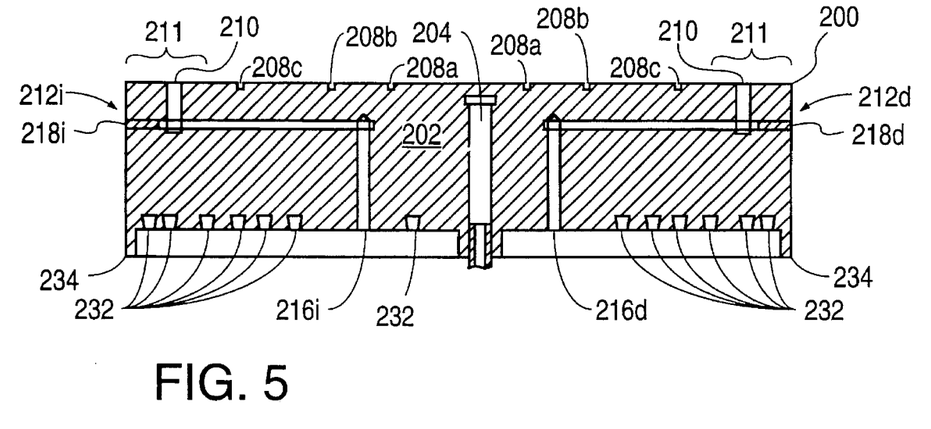
FIG. 5 is a cross sectional view of the platen of FIG. 4.
Figure 6:
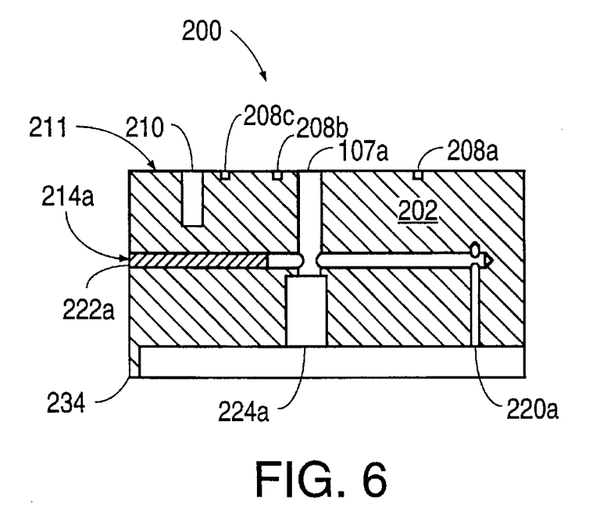
FIG. 6 is a view through a cross-section of a portion of the platen of FIG. 4.

An illustrative platen 200 incorporating a vacuum chuck is shown in FIGS. 4, 5, and 6. The major component of the platen 200 is a circular block 202 of aluminum or other suitable material such as stainless steel. As viewed from the top (FIG. 4), the upper surface of the platen block 202 is provided with 8 vacuum holes 205a–205h from which radial vacuum grooves 206a–206h extend. The end of vacuum line 204, which appears as a central blind hole, lies 0.25 inches below the top surface of platen block 202. The top of vacuum line 204 is 0.32 inches in diameter, and decreases, approximately 0.38 inches from the top of vacuum line 204, to a diameter of 0.25 inches. Vacuum line 204 extends through the bottom of platen block 202. The radial grooves 206a–206h are rectangular in cross section, although other shapes are suitable as well, and are 0.118 inches deep and 0.128 inches wide. The eight radial grooves 206a–206h are regularly disposed at forty-five degree angles from one another. Radial grooves 206a–206h intersect concentric annular vacuum grooves 208a, 208b, and 208c and radial vacuum grooves 209a–209q which like the radial grooves 206a–206h are rectangular in cross section and measure 0.118 inches deep and 0.128 inches wide. The outer radius of the inner annular groove 208a is 1.42 inches, the outer radius of the middle annular groove 208b is 2.40 inches, and the outer radius of the outer annular groove 208c is 3.38 inches. The outer radius of annular groove 208c may be increased if desired to contact a wafer backside region contiguous to the edge of a wafer placed on the wafer contact, i.e. a portion of the top surface of platen 200 beneath the wafer positioned on platen 200. Although the diametrical dimensions referred to above are suitable for processing an 8 inch diameter wafer, they may be scaled so as to facilitate the processing of wafers with a variety of diameters.

Referring to FIG. 5, a tube (not shown) is fastened to vacuum line 204 by a suitable fastener and the combined force exerted through the vacuum grooves 206a–206h, 208a–208c, and 209a–209q is sufficient to uniformly and tightly retain a wafer on the platen 200 during processing.

Another well known technique uses electrostatic attraction to secure the wafers to the platens 14a–14e. An electrostatic clamping technique is described in U.S. Pat. No. 4,184,188 by Briglia, which is hereby incorporated by reference in its entirety.

An additional technique of securing a wafer to the platens 14a–14e involves placing a wafer on a platen, such as platen 202 without vacuum holes and grooves, and allowing gravity to retain the wafer in place. However, the excellent heat transfer (discussed below) between the wafer and platen achieved with other techniques due to uniform, tight retention, such as the vacuum chuck technique discussed above, is somewhat reduced.

In order to stimulate the deposition of material onto the wafer being processed, heat is provided to the wafer. One method of providing heat to the wafer involves heating each of the respective platens 14a–14e which transfers heat to the wafers sitting respectively thereon. Referring to illustrative platen 200 in FIG. 5, a spiral groove 232 is incorporated into the bottom of platen block 202 to accommodate a heating element, both of which are fully described in U.S. Pat. No. 5,230,741.

In some deposition operations, and particularly in the CVD deposition of metals and metal compounds such as tungsten, titanium nitride, and silicides, one may wish to exclude deposition of material from the wafer backside and from the wafer edge. One method of achieving this result involves introducing deposition control gas near an edge of a wafer positioned on a platen from within each of the respective platens 14a–14e. The term "deposition control" gas means that the deposition control gas assists in controlling or eliminating chemical vapor deposition of material on certain portions of the wafer. For example, in one embodiment the deposition control gas contains chemicals, such as hydrogen, that enhance deposition near areas of a wafer such as the frontside peripheral region of a wafer exposed to a mixture of the deposition control gas and process gas, while excluding process gas from other portions such as the backside and edge to prevent unwanted deposition thereon. Since the edge of a wafer may have multiple planar and non-planar, beveled and non-beveled edge surfaces, the term "edge" is intended to encompass all non-frontside, non-backside surfaces.

Referring to the illustrative platen 200 in FIGS. 4–6, integral gas lines and gas grooves are incorporated in platen 200 to facilitate the introduction of deposition control gas from within the platen. An annular gas groove 210 is provided within a peripheral region 211 of the top surface of platen block 202 outside of the outermost annular vacuum groove 208c. The annular groove 210 is rectangular in cross section, measuring 0.093 inches wide and 0.50 inches deep. The inside diameter preferably exceeds the diameter of a wafer being processed and is 7.843 inches and the outside diameter is 7.936 inches. Placing the opening of gas groove 210 beyond the edge of a wafer contact increases the contact surface area between platen block 202 and the wafer, thereby achieving greater thermal uniformity in the wafer.

The gas groove 210 intersects a network of radial gas lines 212a–212j for distributing gas to the backside of the wafer to be processed. Radial gas lines 212a–212j are shown in hidden lines in FIG. 4, and selectively in cross section in FIG. 5. Lines 212a–212j are radially distributed in the platen block 202 at 36 degree intervals. Each of the bores for the ten gas lines 212a–212j is 0.156 inches in diameter, begins in the vertical edge of the platen block 202 at a distance of 0.262 inches from the top surface of the platen block 202 to the bore centerline, is parallel to the top surface of the platen block 202, and extends sufficiently into the platen block 202 to intersect a respective one of the ten vertical bores for gas lines 216a–216j, which extend from the bottom surface of the platen block 202 (FIG. 5). The gas lines 212a–212j are plugged by respective plugs 218a–218j (see, e.g., plugs 218d and 218i in FIG. 5), which extend 0.25 inches from the outside vertical edge of the platen block 202 to just short of the gas groove 210. The plugs 218a–218j are press fitted into gas grooves 212a–212j. The diameter of the bores for gas lines 216a–216j is 0.125 inches. The total thickness of the platen 200 is 1.694 inches with an outside diameter of 9 inches, although other dimensions may be used to accommodate various factors such as process chamber sizes and wafer sizes.

A second network of radial gas lines 214a–214c is bored in the platen block 202 for distributing backside gas to holes 107a–107c, which accommodate wafer lift pins such as wafer lift pins 20c and 21c shown in FIG. 3. (Holes 107a–107c, respective index holes (exemplified by index hole 224a shown in FIG. 6, and index sleeves (not shown) are fully described in U.S. Pat. No. 5,230,741). Radial gas lines 214a–214c are shown in hidden lines in FIG. 4, and selectively in cross section in FIG. 6. Each of the bores for the three gas lines 214a–214c is 0.156 inches in diameter, begins in the vertical edge of the platen block 202 a distance 0.75 inches from the top surface of the platen block 202 to the bore centerline, is parallel to the top surface of the platen block 202, and extends sufficiently into the platen block 202 to intersect a respective one of the three vertical bores for gas lines 220a–220c, which extend from the bottom surface of the platen block 202 (exemplified by gas line 220a shown in FIG. 6). The gas lines 214a–214c are plugged by respective plugs 222a–222c (exemplified by plug 222a in FIG. 6), which extend 0.25 inches from the outside vertical edge of the platen block 202 to just short of the respective gas lines 220a–220c. The plugs 222a–222c are press fitted into gas lines 214a–214c. The diameter of the bores for gas lines 220a–220c is 0.063 inches.

Holes 107a–107c, which accommodate wafer lift pins such as wafer lift pins 20c and 21c shown in FIG. 3, are 0.187 inches in diameter and pass through platen block 202. Toward the bottom surface of the platen block 202, holes 107a–107c merge into, respectively, index holes 224a–224c, which are 0.312 inches in diameter and provided to receive respective index sleeves (not shown) of a base pedestal such as base pedestals 16b, 16c, or 16d (FIG. 3). The center axes of holes 107a–107c are offset from, respectively, the center axes of holes 224a–224c, to accommodate the eccentricity between holes 107a–107c and index sleeves (not shown). The dimensions of a platen block suitable for accommodating 5 inch wafers is described in U.S. Pat. No. 5,230,741 with the exception that the inside diameter of gas groove 210 in U.S. Pat. No. 5,230,741 is preferably increased to 5.790 inches and the outside diameter is preferably increased to 5.976 inches.

To further appreciate the function of the deposition control gas when introduced at the process stations 4a–4e in coordination with the introduction of a process gas at the gas dispersion heads 12a–12e, consider the illustrative platen 200 of FIGS. 4–6. The deposition control gas is introduced through annular groove 210. The volume of deposition control gas furnished to the gas groove 210 is determined based on the desired rate of venting and the effect of the deposition control gas on the wafer frontside deposition.

In one embodiment described in conjunction with illustrative platen 200, the deposition control gas vents from within platens 14a–14e (FIG. 1) into the process chamber 2. In the process chamber 2, the deposition control gas mixes with the process gas and is vented through the vent ports 426a–426f (FIG. 2) and 6a–6f (FIG. 1).

The deposition control gas also vents through the lifting pin holes 107a–107c, to prevent the process gas from reaching the area around the lifting pins and the wafer backside through the lift pin holes 107a–107c.

The deposition control gas is introduced into the interior volume of a pedestal base, such as pedestal base 16b, as discussed in conjunction with backside gas in U.S. Pat. No. 5,230,741. Referring to FIGS. 4–6, from the interior volume of a pedestal base under the platen block 202, the deposition control gas enters gas lines 216a–216j and flows from there to groove 210 through respective gas lines 212a–212j. The deposition control gas also enters gas lines 220a–220c, from which it flows to lift pin holes 107a–107c through respective gas lines 214a–214c. As gas lines 220a–220c are smaller than gas lines 216a–216j, the flow through them is relatively restricted. The deposition control gas is heated both within the volume under the platen block 202 and as it flows through the various gas lines.

A variety of process gases and deposition control gases may be selected. For example, in depositing a tungsten film at a deposition rate of 2000 Å/min, for example, the product reactant $WF_6$ is used under the reactant conditions of $H_2$ and Ar at a deposition temperature of 400 degrees C and an operating pressure of 40 Torr. The $WF_6$ and $H_2$ gases are the reactive components of the process. In depositing other films, other process gases with different reactive components may be used. In the apparatus of FIGS. 1, 2, and 3, the flow of process gas to each of the dispersion heads 12a–12e is on the order of 2–3 standard liters per minute. The actual pressure on the wafer being processed is somewhat greater than 40 Torr because the gas stream from the dispersion head impinges directly on the surface of the wafer. Under these process conditions, a suitable deposition control gas is argon, hydrogen, or a mixture of argon and hydrogen. The various constituent gases are delivered to and mixed in a suitable manifold, as is well known in the art. The flow of deposition control gas provided to each of the process stations 4a–4e under such conditions ranges from about 300 standard cubic centimeters per minute (sccm) to about 3 standard liters per minute.

Uniformity of deposition near the frontside periphery of the wafers being processed is further improved by mixing a reactive component of the process gas with the selected inert gas or gases to obtain the deposition control gas. In the example of the preceding paragraph in which the product reactant $WF_6$ is used with the reactive component $H_2$ and the carrier gas Ar or $N_2$ or a mixture of Ar and $N_2$, improved uniformity of edge deposition is obtained by mixing the reactive component $H_2$ with Ar or $N_2$ or a mixture of Ar and $N_2$ to obtain the deposition control gas. The proper proportion of reactive component to inert gas is determined empirically. The process gas mixture (e.g. $WF_6+H_2+Ar$ flow ratios and $WF_6+H_2+Ar$ total flow) land deposition control gas mixture (e.g. $H_2+Ar$ flow and $H_2+Ar$ total flow) are interactively combined and changed to produce the best frontside wafer uniformity while maintaining process gas exclusion from the wafer edge and backside.

Suitable inert gases for use in the deposition control gas mixture include argon, nitrogen, and helium or any suitable combination thereof. An inert gas is any gas that does not react adversely with the materials present in the process chamber 2 and in the gas distribution system, and that does not participate in the chemical reactions involved. Moreover, it is desirable that the thermal conductivity and heat capacity of the inert gas be sufficient to achieve good temperature uniformity across the wafers being processed.

The deposition control gas, in some embodiments, is further assisted in excluding process gas from the wafer backside and edge by the use of a structure such as an "exclusion guard" in combination with the introduction of deposition control gas during processing.

Figure 7:
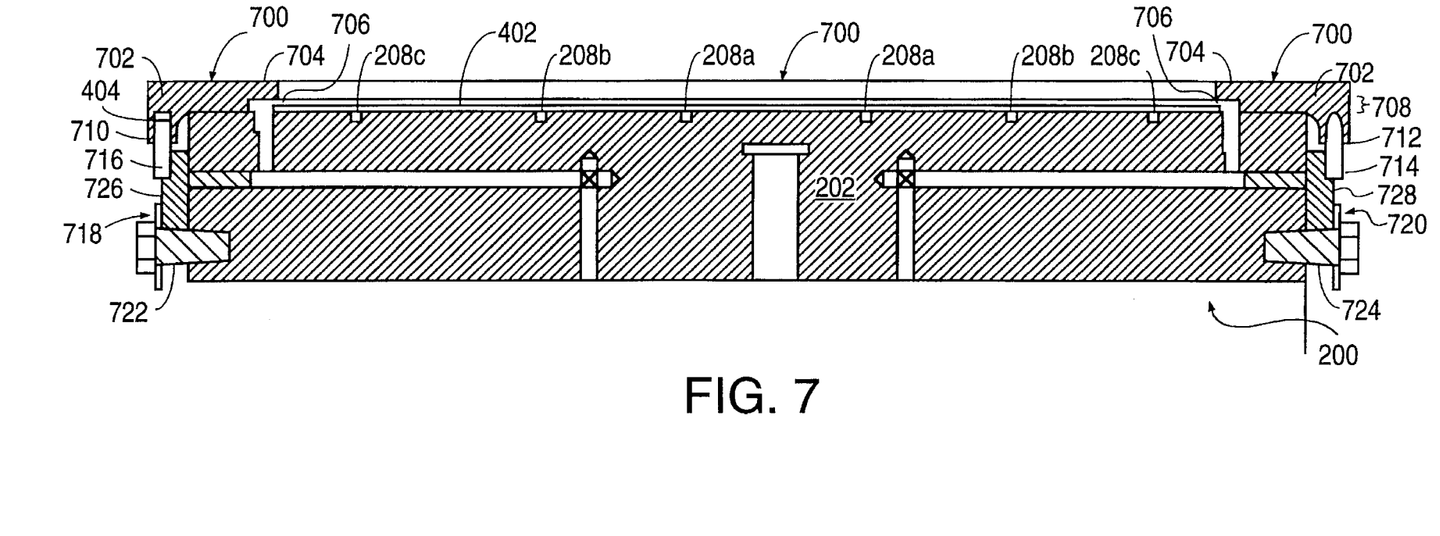
FIG. 7 is a cross-sectional view of a first exclusion guard embodiment in combination with a platen.

One embodiment of an exclusion guard, which is made of any suitable material such as metal or ceramic (including, for example, alumina), is exclusion guard 700 shown in cross section in FIG. 7. Exclusion guard 700 is shown in conjunction with platen 200 although other platen designs may be used as well. In FIG. 7, a wafer such as wafer 402 is held in place on platen block 202 by the radial grooves 206a–206h (hidden), annular grooves 208a–208c, and radial grooves 209a–209q (hidden) of the vacuum chuck. FIG. 7 depicts exclusion guard 700 with a body 702, a platform section 708, and an extension 704. The leading inside edge of extension 704 extends approximately 1.5 mm over the frontside periphery of wafer 402. The extension 702 is separated from the wafer 402 frontside by a restrictive opening 706 between wafer 402 and exclusion guard 700. The thickness of extension 702 is 0.065 inches, the thickness of the platform section is 0.055 inches, and the distance from the bottom of flange 404 to the bottom of platform section 708 is 0.130 inches.

Figure 8:
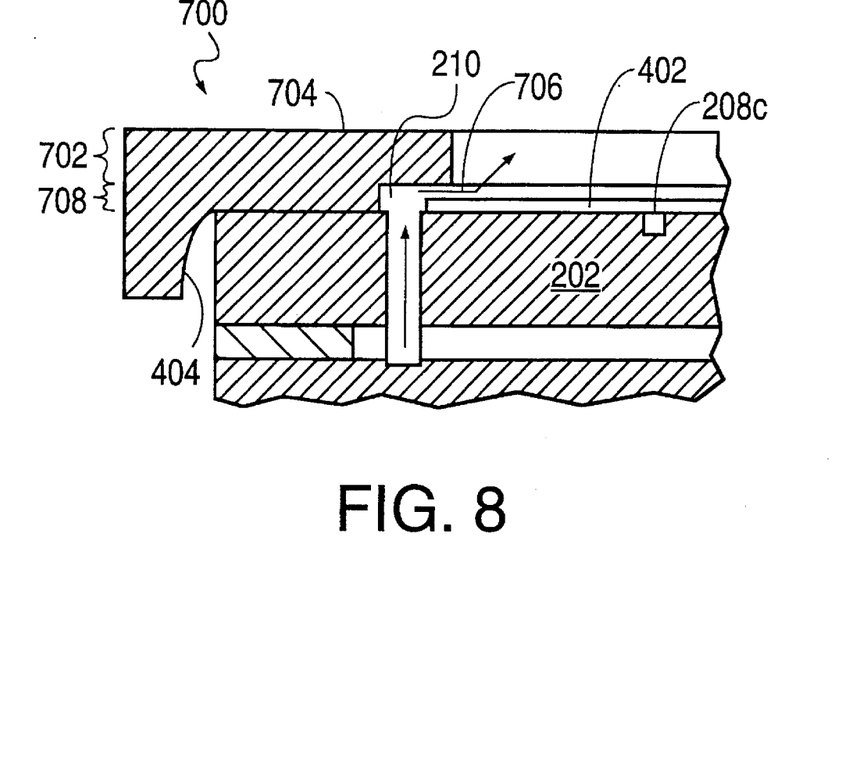
FIG. 8 is a partial cross-sectional view of the exclusion guard and platen shown in FIG. 7.

FIG. 8 illustrates a partial cross sectional view of the exclusion guard 700 in FIG. 7. During processing, deposition control gas is introduced in platen block 202 as discussed above. At the deposition control gas flow rates discussed above, restrictive opening 706 serves to equalize the pressure in a plenum formed in part by gas groove 210 and the cavity between gas groove 210 and extension 704. As a result, deposition control gas flow, as indicated by the arrows in FIG. 8, is uniform through restrictive opening 706 over the entire wafer frontside periphery. This uniform deposition control gas flow denies process gas access to the wafer 402 edge and backside, thereby preventing material deposition on these surfaces.

The dimensions of restrictive opening 706 are related to the flow rate of the deposition control gas. The ratio of deposition control gas flow rate to restrictive opening area is preferably approximately 10 sccm per 1 mm² of restrictive opening area. A preferable width of restrictive opening 706, i.e. the separation distance between extension 704 and the frontside of wafer 402, is preferably 0.050 mm or less when extension 704 extends 1.5 mm as discussed above. Therefore, the deposition control gas flow rate is preferably approximately 300 sccm. However, the width of restrictive opening 706 may vary between approximately 0.025 mm to 0.077 mm with the flow rate of deposition control gas being adjusted accordingly. The length of the restrictive opening is preferably 10 times the width of the restrictive opening to achieve uniform gas flow around the wafer 402 edge. The flow rate of the deposition control gas is also inversely related to the quantity of reactive component present in the deposition control gas. Therefore, when the flow rate is reduced the quantity of a reactive component (e.g. $H_2$) may be increased to achieve the desired uniformity of deposition on the frontside of wafer 402 and vice versa.

Typically, it is desirable to obtain approximately uniform material deposition on the frontside of wafer 402 to as close to the edge of wafer 402 as possible. To improve the extent of uniform material deposition on the wafer 402 frontside periphery, the deposition control gas preferably includes one or more reactive components of the process gas as discussed above. The reactive component in the deposition control gas enhances deposition at the wafer 402 periphery to compensate for any process gas flow interference in a region caused by the deposition control gas venting from restrictive opening 706 and the physical presence of a portion of the extension 704 extending over the wafer 402 and present in the flow pattern of the process gas. For example, when depositing W and using $H_2$ as the reactive component in the deposition control gas, the deposition rate of W (produced by reacting $WF_6$ with $H_2$) varies proportionately with the square root of the $H_2$ concentration e.g. a four times increase in the quantity of $H_2$ increases the deposition rate of W by a factor of two. Therefore, to enhance the deposition of W by a factor of two at the frontside periphery of a wafer, the $H_2$ concentration must be increased by a factor of four at the frontside periphery of the wafer. Note that a greater overall concentration of $H_2$ may be required in the deposition control gas to assure that an increase of four times reaches the wafer frontside periphery. However, when increasing one reactive component in the deposition control gas, for example $H_2$, a reactive component in the process gas, for example $WF_6$, is preferably supplied to sustain the kinetically possible deposition rate. Otherwise, the reaction may be "starved" in regions rich in $H_2$ and deficient in $WF_6$.

The interference of process gas flow by deposition control gas venting can be minimized by reducing the flow rate of the deposition control gas. However, the flow rate is preferably maintained at approximately 10 sccm per 1 mm² of restrictive opening area which is sufficient to create a uniform pressure region underneath extension 704. The deposition control gas flow rate through the restrictive opening 706 is directly proportional to the size of the restrictive opening 706 and also inversely proportional to an extension overlap distance, i.e. the distance extension 704 extends over the frontside of wafer 402. Therefore, reductions in deposition control gas flow rates can be achieved by decreasing the size of restrictive opening 706 and/or increasing the extension overlap distance. While increasing the extension overlap distance to 3 mm or greater relaxes the need for careful control of the size of the restrictive opening 706, i.e. a 0.5 mm restrictive opening 706 size results in an increase in the overlap distance, it adversely affects uniform material deposition at distances further from the edge of wafer 402.

Notice that except for wafer 402 backside portions overlying the vacuum grooves 208a, 208b, and 206a–206h (hidden), the backside of wafer 402 is in full contact with top surface of platen block 202. This large contact facilitates uniform thermal transfer from the platen block 202 to the entire wafer 402 backside. Uniform thermal distribution along the wafer 402 backside facilitates uniform thermal distribution along the wafer 402 frontside which enhances approximately uniform deposition of materials across the frontside of wafer 402.

While the dimensions of the exclusion guard 700 are not critical, they are selected in accordance with the dimensions of the wafer 402 and the flow capacity of the deposition control gas delivery system.

Figure 9:
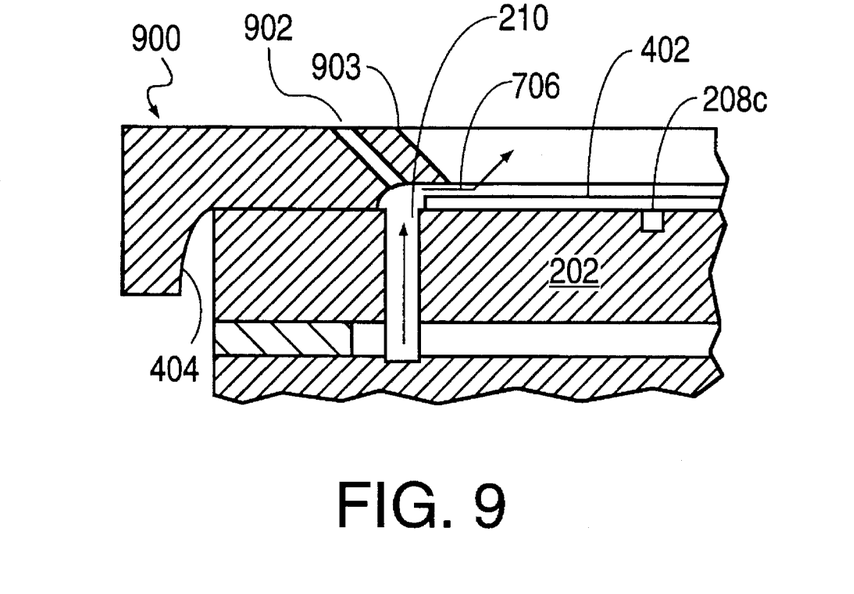
FIG. 9 is a cross-sectional view of the exclusion guard and platen of FIG. 7 modified to include holes for venting deposition control gas during wafer processing.
Figure 10:
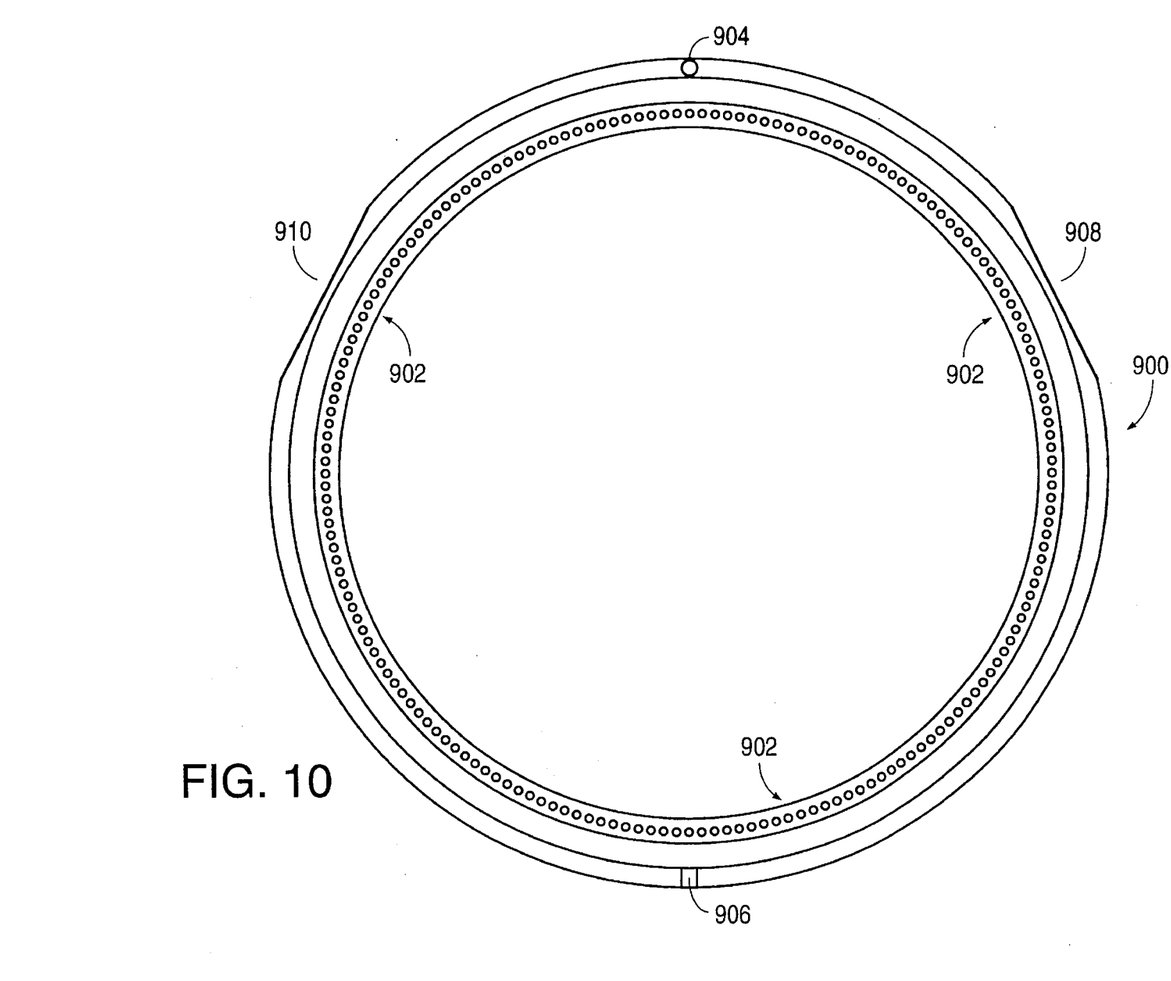
FIG. 10 is a bottom view of the exclusion guard of FIG. 9.
Figure 11:
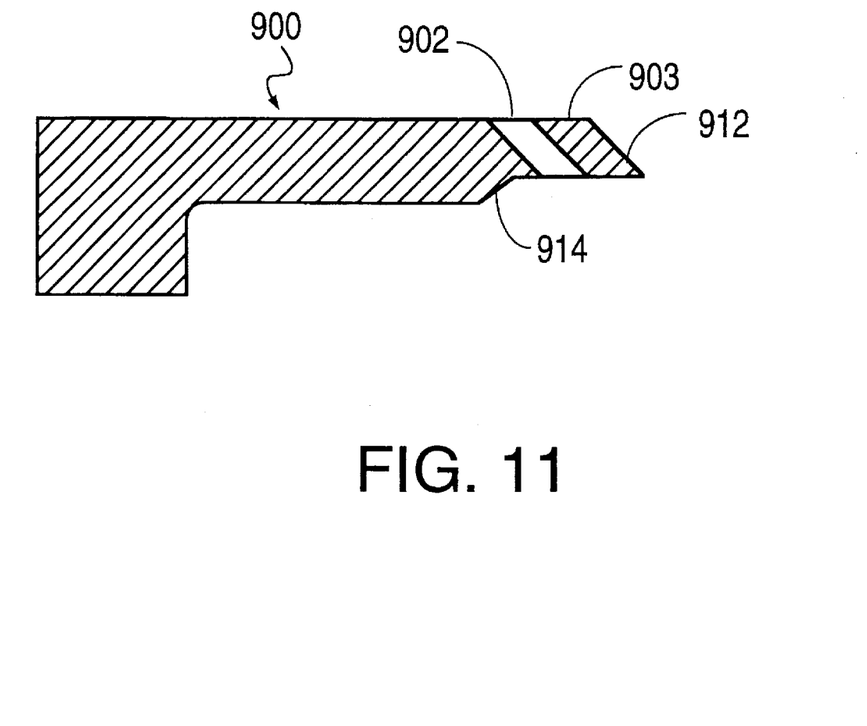
FIG. 11 is a partial cross-sectional view of the exclusion guard of FIG. 9 shown in isolation.

In some processes a reduced flow of deposition control gas may not deliver sufficient reactive component(s) to the interference region, so that the extent of uniform deposition may not be as great as desired. Providing orifices in an exclusion guard minimizes deposition control gas interference while preferably increasing the supply of reactive components to the wafer 402 frontside periphery. Referring to FIGS. 9, 10 and 11, exclusion guard 700 has been modified to form exclusion guard 900 with orifices, for example holes 902, and extension 903 which extends 1.5 mm over the frontside periphery of wafer 402. Note that the leading edge of exclusion guard 900 has been modified to slope at a 30 degree angle to improve the flow of deposition control gas and process gas at the frontside periphery of wafer 402. Holes 902 extend from the top surface of exclusion guard 900 to a deposition control gas source. The total amount of deposition control gas entering the ambient of process chamber 2 equals the amount of deposition control gas flowing through restrictive opening 706 and holes 902. Therefore, the total amount of deposition control gas can be increased in the region of the process chamber 2 over the wafer frontside periphery without increasing the flow rate of deposition control gas through restrictive opening 706. The holes 902 should preferably vent a portion of the deposition control gas into the process chamber 2 (FIG. 3) toward the outside edge of exclusion guard 900 to avoid unnecessarily perturbing the gases in the region of the process chamber 2 over the wafer frontside periphery. Deposition control gas interference with process gas flow is minimized while the supply of reactant gas components to the frontside periphery of wafer 402 is increased thereby facilitating uniform wafer frontside deposition. Other orientations, including holes perpendicular to the top surface of exclusion guard 900 or slanting the holes at an angle in the direction of the wafer frontside center, may be suitable in some applications. The holes 902 may be manufactured by drilling through the top surface of exclusion guard 900 and into the cavity beneath extension 704. Alternatively (not shown), the holes 902 may be manufactured by drilling through the top surface of exclusion guard 900, into platen block 202, and into gas groove 210.

FIG. 10 illustrates a bottom view of exclusion guard 900 with the opening of holes 902 shown as solid circles. There are 180 holes 902 spaced 2 degrees apart with each hole having a diameter of 0.079 inches. An alignment hole 904 and alignment slot 906 are also shown. The outside edge of exclusion guard 900 preferably has indentations 908 and 910 to accommodate adjacent exclusion guards in process chamber 2. The overall diameter of exclusion guard 900 is 9.67 inches, the inside diameter of extension 903 is 7.756 inches, and the extension outside diameter is 8.35 inches.

Referring to FIG. 11, a portion of exclusion guard 900 is shown in isolation. Leading edge 912 slopes at an angle of 30 degrees, and hole 902 slopes at an angle of 45 degrees. Extension transition surface 914 slopes at an angle of 30 degrees.

Figure 12:
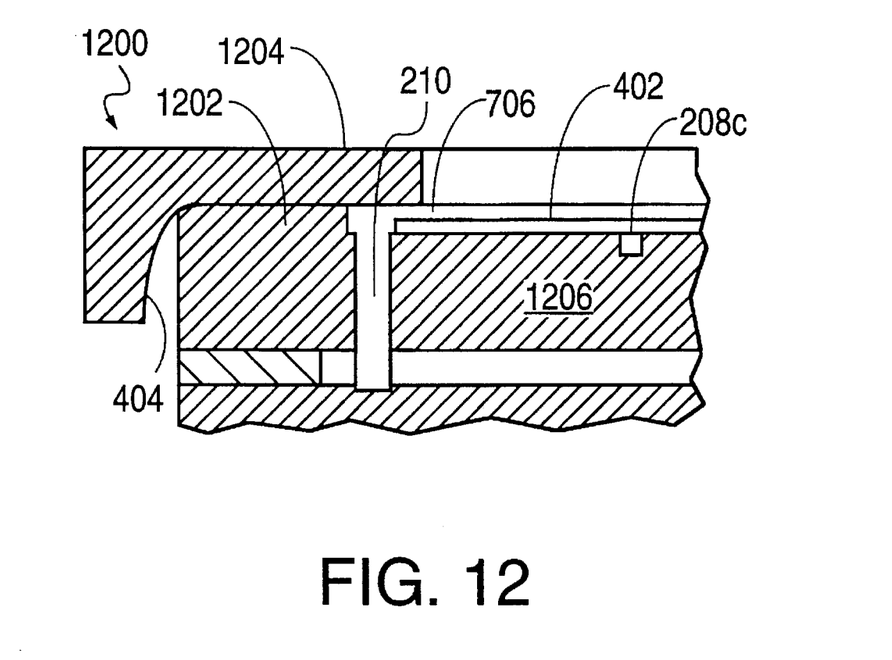
FIG. 12 is a partial cross-sectional view of a another exclusion guard embodiment in combination with a platen.

Referring to FIG. 12, another exclusion guard embodiment, exclusion guard 1200, is illustrated. Exclusion guard 1200 is identical to exclusion guard 700 except that exclusion guard 1200 does not have a platform section. In order to elevate extension 1204 over the frontside periphery of wafer 402, platen block 1206 includes integral, annular, elevated platform 1202. Platen block 1206 differs from platen block 202 only in the presence of platforms 1202. The complete discussion of exclusion guard 700 in conjunction with platen block 202 is otherwise fully applicable. Additionally, orifices (not shown) such as holes may be drilled through exclusion guard 1200 and into a deposition control gas source as discussed in conjunction with FIG. 9.

The respective exclusion guards of FIGS. 7, 9, and 12 may be modified to form split exclusion guards (not shown) i.e. an interior exclusion guard and an exterior exclusion guard separated by a channel. The interior exclusion guard extends over the frontside periphery of wafer 402 forming a restrictive opening to deposition control gas flow. The interior exclusion guard may be a continuous, independent exclusion guard or may be attached to the exterior exclusion guard using any suitable structure that provides minimal interference with the flow of deposition control gas through the channel. The channel also forms a restrictive opening and extends from the top surface of the respective exclusion guard to a deposition control gas source such as gas groove 210. The orientation of channels, the effect on deposition control gas flow, and material deposition on the frontside periphery of wafer 402 is the same as discussed above in conjunction with orifices 902 in FIGS. 9, 10, and 11. The channels may be manufactured by drilling through the top surface of exclusion guard and into the cavity beneath the respective exclusion guard extensions.

If precise alignment accuracy is desired and is preferable when forming a restrictive opening of 0.50 mm or less between an exclusion guard and an edge of a wafer, the exclusion guards in FIGS. 7–12 may be provided with any suitable type and arrangement of alignment means such as, for example, hole-pin pairs (not shown) or slot-wedge pairs (not shown) provided within the contact region of the exclusion guards within the peripheral region 211 of the platen block 202. Another such alignment means, which is illustrated in FIGS. 7–10, and 12, involves the use of flanges such as 404, which are spaced along the outside edge of the exclusion guards and extend down in such a manner as to engage the outside edge of the respective platen blocks associated with the exclusion guards in FIGS. 7–10, and 12 and compel alignment of the exclusion guards with the respective platen blocks, hence with the wafer 402. The flange members 404 may be tapered as shown to engage progressively the outside edge of the respective platen blocks. An additional alignment means is preferably utilized and includes alignment slot 710 and alignment hole 712 in FIG. 7. Alignment slot 710 and alignment hole 712 are identical to alignment slot 906 and alignment hole 904 in FIG. 10. Referring to FIG. 7, guide blocks 718 and 720 with alignment pins 714 and 716, respectively, are fastened to platen block 202 with any suitable fastener such as, for example, bolts 722 and 724, respectively, Guide blocks 718 and 720 also include spacers 726 and 728, respectively. The alignment slot 710 and alignment hole 712 in the exclusion guard 700 are mated with alignment pins 714 and 716. Alignment pins 714 and 716 are oriented to insure proper positioning of exclusion guard 700. All of the exclusion guards and platens include the alignment slot and hole and alignment pins, respectively.

Although physical restrictions to deposition control gas flow have been defined with reference to an exclusion guard extension and the frontside of a wafer in FIGS. 7–12, alternate and/or combination restrictions may be provided. For example, gas groove 210 in FIGS. 4–9, 11, and 12 may be manufactured so that the opening of gas groove 210 at the surface of platen block 202 forms a restrictive opening to deposition control gas flow. Gas groove 210 may be manufactured to form a restrictive opening by, for example, force fitting an insert, made of a material having a thermal coefficient of expansion similar to the coefficient of expansion of the platen block, into gas groove 210 to form a continuous restrictive opening. The thickness of the insert is preferably ten times the width of the restrictive opening. When an alternate restriction is provided, the separation distance between the exclusion guard extension and the wafer frontside may be increased. Additionally, when the restriction is placed near the edge of the wafer, the deposition control gas prevents deposition on the wafer backside and wholly or partially on the wafer edge.

While our invention has been described with respect to the embodiments and variations set forth above, these embodiments and variations are illustrative and our invention is not to be considered limited in scope to these embodiments and variations. For example, the various shapes and dimensions and the various flow rates and pressures set forth herein are illustrative, and other shapes, dimensions, flow rates, and pressures may also be effective for the intended purpose. Also, features such as the platen blocks, exclusion guards, gas grooves and lines, and vacuum grooves and lines discussed herein may be scaled to accommodate varying wafer sizes. Moreover, the deposition process discussed herein is illustrative, and other processes may also be effective for the intended purpose. Furthermore, while certain dimensions and locations of restrictive openings and deposition control gas composition have been described in conjunction with the various platen blocks and exclusion guards, it will be appreciated that the dimensions and locations of restrictive openings and deposition control gas composition may be varied in order to obtain uniform deposition control gas flow around the periphery of a wafer and uniform material deposition on the frontside of the wafer. Moreover, in all exclusion guard and platen cases, an additional restrictive opening can be incorporated within the platen itself to achieve more uniform distribution of gas to all points at the wafer periphery. Accordingly, other embodiments and variations not described herein are to be considered within the scope of our invention as defined by the following claims.

What is claimed is:

1. A method of processing a wafer in a deposition chamber, comprising the steps of:

placing the wafer on a wafer support surface;

positioning an exclusion guard in proximity to the wafer edge and a frontside periphery of the wafer;

providing approximately uniform separation between a portion of the exclusion guard and the frontside periphery of the wafer;

introducing a process gas proximate to a frontside interior region of the wafer;

introducing a deposition control gas between the exclusion guard portion and the wafer; and maintaining a non-negative pressure differential from the introduced deposition control gas to the frontside interior region of the wafer.

2. The method of processing a wafer in a deposition chamber as in claim 1 further comprising the step of: heating the wafer support surface.

3. The method of processing a wafer in a deposition chamber as in claim 1 wherein the exclusion guard is ceramic.

4. The method of processing a wafer in a deposition chamber as in claim 1 wherein the process gas includes tungsten.

5. The method of processing a wafer in a deposition chamber as in claim 1 wherein the deposition control gas includes argon.

6. The method of processing a wafer in a deposition chamber as in claim 5 wherein the deposition control gas further includes hydrogen.

7. The method of processing a wafer in a deposition chamber as in claim 1 wherein the exclusion guard is positioned approximately 0.05 mm from the wafer frontside periphery and extends approximately 1.5 mm across the wafer.

8. The method of processing a wafer in a deposition chamber as in claim 1 wherein the exclusion guard is positioned approximately 0.025 mm to 0.077 mm from the wafer frontside periphery.

9. The method of processing a wafer in a deposition chamber as in claim 1 wherein the deposition control gas is introduced at approximately 300 standard cubic centimeters per minute.

10. The method of processing a wafer in a deposition chamber as in claim 1 further comprising the step of:

introducing deposition control gas into the deposition chamber and away from the frontside interior region of the wafer to enhance processing proximate to the wafer frontside periphery.

11. The method of processing a wafer in a deposition chamber as in claim 10 wherein the deposition control gas is introduced through approximately uniformly spaced orifices extending through the exclusion guard.

12. The method of processing a wafer in a deposition chamber as in claim 1 wherein the deposition control gas is introduced through an opening in the wafer support surface between the wafer and exclusion guard.

13. The method of processing a wafer in a deposition chamber as in claim 1 further comprising the step of:

applying vacuum to a backside of the wafer through the wafer support surface to secure the wafer to the wafer support surface.

14. The method of processing a wafer in a deposition chamber as in claim 1 wherein the wafer is in substantially full contact with the wafer support surface.

15. A method of protecting the edge and backside of a wafer disposed in a process chamber during processing, comprising the steps of:

restraining the wafer on an interior region of a platen;

guarding the wafer edge and backside with an exclusion guard;

introducing a process gas comprising a mixture of a product reactant and a first reactant into the process chamber;

introducing a deposition control gas through an opening in the platen surrounding the interior region comprising a gas different than the process gas into a peripheral space defined by an edge of the wafer and an interior surface of the exclusion guard; and maintaining a non-negative pressure differential from the peripheral space to a process chamber region proximate to a frontside of the wafer so that the process gas is excluded from contact with the side and backside of the wafer.

16. The method as in claim 15 wherein the wafer is restrained by a vacuum chuck disposed in the interior region of the platen.

17. The method as in claim 15 wherein the deposition control gas includes the first reactant and an inert gas.

18. The method as in claim 17 wherein the first reactant is hydrogen and the inert gas is argon.

19. The method as in claim 15 wherein the exclusion guard includes an interior region proximate to the platen interior region, and the interior surface of the exclusion guard is defined by a basal cavity in the interior region of the exclusion guard.

20. The method as in claim 15 wherein the opening in the platen surrounding the interior region is an annular gas groove.

* * * * *